(12) United States Patent
Erhart et al.

(10) Patent No.: US 6,930,929 B1
(45) Date of Patent: Aug. 16, 2005

(54) SIMULTANEOUS READ-WRITE MEMORY CELL AT THE BIT LEVEL FOR A GRAPHICS DISPLAY

(75) Inventors: Richard Alexander Erhart, Tempe, AZ (US); Arif Alam, Chandler, AZ (US); Christopher A. Ludden, Pittsford, NY (US); Bruce C. Moore, Glendale, AZ (US); Donald Camp, Peoria, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 317 days.

(21) Appl. No.: 10/288,553

(22) Filed: Nov. 4, 2002

(51) Int. Cl.[7] .......................... G11C 8/12; G09G 5/397
(52) U.S. Cl. ................. 365/189.04; 365/220; 365/219; 365/189.02; 365/230.03; 345/547; 345/560
(58) Field of Search ................................ 365/219, 220, 365/221, 222, 189.04, 189.02, 230.05, 230.03; 345/547, 549, 560

(56) References Cited

U.S. PATENT DOCUMENTS

| | | | |
|---|---|---|---|
| 6,657,881 B1 * | 12/2003 | Rickes et al. ............... | 365/145 |
| 6,775,191 B1 * | 8/2004 | Pancholy et al. ........... | 365/194 |
| 2002/0018371 A1 * | 2/2002 | Nasu ..................... | 365/189.01 |

* cited by examiner

*Primary Examiner*—Andrew Q. Tran
(74) *Attorney, Agent, or Firm*—Merchant & Gould; Joshua W. Korver

(57) ABSTRACT

An improved memory for graphics displays includes an improved memory cell. Data may be written and read from the single bit cell simultaneously, eliminating the need for additional memory circuits to service an N column driver for a display. Additionally, the architecture of the memory allows for a signal input port for writing the data to the cell while allowing for multiple parallel output ports for reading the data. The unique architecture eliminates the need for addressing logic and refresh circuitry for display applications.

20 Claims, 6 Drawing Sheets

SIMULTANEOUS READ-WRITE MEMORY CELL AT THE BIT LEVEL FOR A GRAPHICS DISPLAY

FIELD OF THE INVENTION

The present invention relates generally to memory, and more particularly to improved memory for graphics displays.

BACKGROUND OF THE INVENTION

Various types of memories may be utilized in a computer system. Certain types of memory may be used for certain applications. Memory types include Read Only Memory (ROM), Random Access Memory (RAM), serial access memory (SAM), Cache memory, Virtual Memory, and the like. Each type of memory may include a number of different subtypes. For example, two common subtypes of RAM include Static RAM (SRAM), dynamic RAM (DRAM).

In dynamic random access memory (DRAM), a transistor and a capacitor are paired to create a memory cell, which represents a single bit of data. The capacitor holds the bit of information—a logic "0" or a logic "1". The transistor acts as a switch that lets the control circuitry on the memory chip read the capacitor or change its state. The capacitor of the cell is unable to hold its charge for a significant amount of time. In a matter of a few milliseconds, the charge on the capacitor dissipates. Therefore, for DRAM, either the CPU or the memory controller recharges all of the capacitors holding a logic "1" before they discharge. To do this, the memory controller reads the memory and then writes it right back. This refresh operation happens automatically thousands of times per second.

For most applications, at least two DRAM circuits are required for efficient reading and writing of data. For example, a first set of data is written into a first DRAM circuit during a first interval. During a second interval, the first set of data is read from the first DRAM circuit, while a second set of data is written to a second DRAM circuit. During a third interval, a third set of data is written to the first DRAM circuit, while the second set of data is read from the second DRAM circuit, and so on. Each DRAM circuit alternates between a write operation and read operation, increasing the speed at which data may be transferred.

SUMMARY OF THE INVENTION

The present invention is directed towards an improved dynamic memory for graphics displays. The improved memory includes an improved memory cell that essentially interleaves two memory circuits at the bit level. The architecture of the memory cell allows data to be transferred within the single bit cell. The transfer operation of the cell allows data to be written to the cell and read from the cell simultaneously. The improved memory cell operates similar to a DRAM cell without the requirement of refresh circuitry. Also, the improved memory provides an architecture that allows for a single input port for writing data to the memory and multiple parallel output ports for reading data from the memory.

For graphics display applications, usually two separate memory circuits are required to efficiently write and read data. As data is written into the first memory circuit, other data previously written to the second memory circuit is read to the display. The present invention eliminates the need for the second memory circuit by interleaving the functionality of two memories at the bit level and allowing the read and write operations to be performed simultaneously at the cell level.

The improved memory stores incoming video data for reformatting and delivery to the display drivers. Refresh circuitry is not required due to the operation of the memory as a line buffer for the display. Since the memory operates as a line buffer, the data is updated automatically. Also, the die area consumed by the present invention is less than required for static RAM, and the present invention is faster than conventional DRAM which may have insufficient speed to support higher resolutions. The reduction in size and components for the improved memory circuit also reduces the overall power consumption of the memory when compared to conventional memory circuits.

According to one aspect of the invention, a system for storing data for a graphics display includes a first memory cell that is arranged to store a first bit of data and a second memory cell that is arranged to store a second bit of data. A data input is arranged to serially input the first and second bit of data into the first memory cell and the second memory cell respectively. A first data output is arranged to output the first bit of data from the first memory cell, and a second data output is arranged to output the second bit of data from the second memory cell. The first bit of data and the second bit of data are output in parallel from their respective data outputs. The first memory cell is included in a first array of memory cells that are arranged in a first memory block. The second memory cell is included in a second array of memory cells that are arranged in a second memory block.

According to another aspect of the present invention, the system includes a first multiplexer circuit that is associated with the first memory block. The first multiplexer circuit is arranged to output a pre-selected portion of the data corresponding to the first array of memory cells. A second multiplexer circuit is associated with the second memory block. The second multiplexer circuit is arranged to output a pre-selected portion of the data corresponding to the second array of memory cells simultaneously when the pre-selected portion of the data corresponding first array of memory cells is output.

According to another aspect of the present invention, the one-bit memory cell includes three portions. A first portion of the memory cell is arranged to store a first stored logic level at a first node in response to a bit of a data input signal during a write cycle. A second portion of the memory cell that is arranged to store a second stored logic level at a second node in response to the first stored logic level during a transfer cycle. A third portion of the memory cell that is arranged to store a third stored logic level at a third node in response to the second stored logic level during a read cycle. The third stored logic level corresponds to the bit of the data input signal and is transmitted from the memory cell through an output port for use in generating an image on the graphics display.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
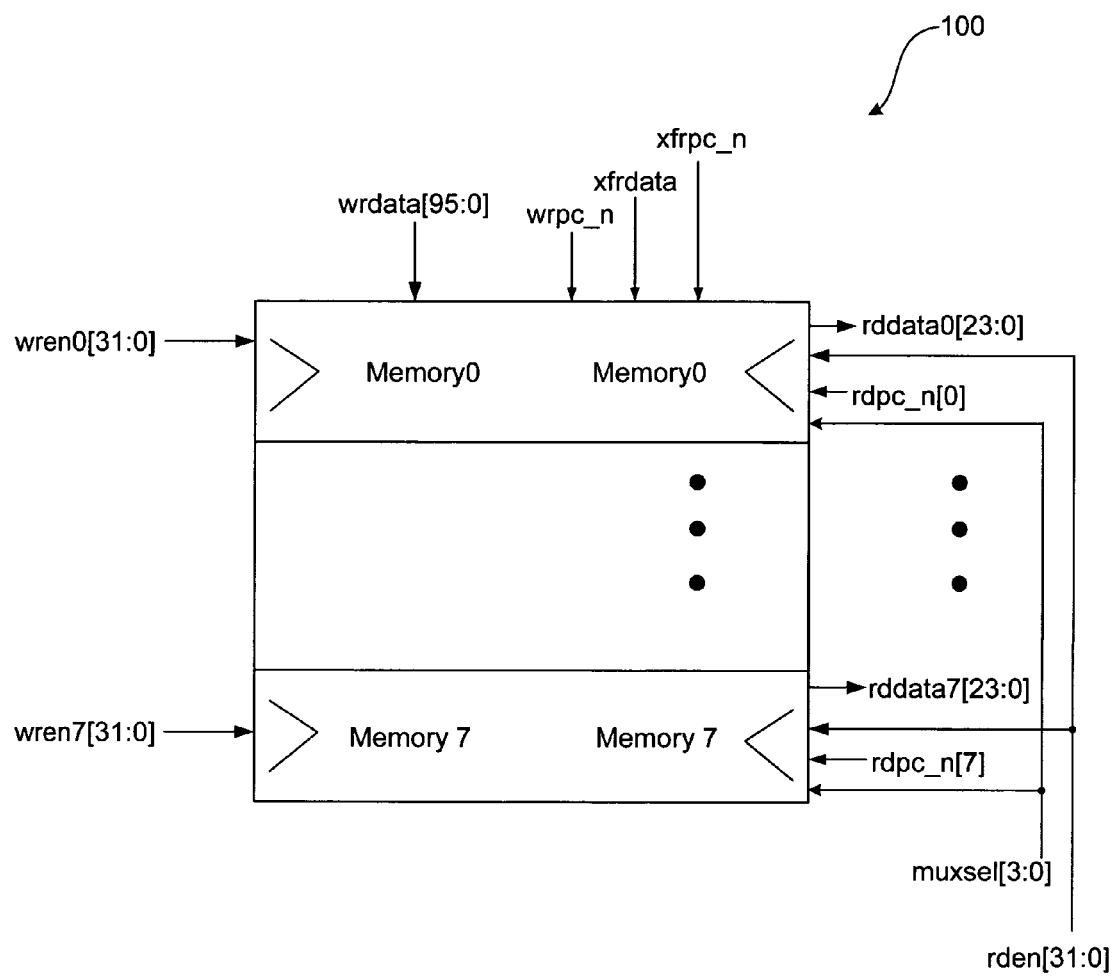
FIG. 1 illustrates a schematic diagram of an exemplary structure for an improved memory for graphics displays.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views. The terms "simultaneous" or "simultaneously" refer to a condition or process existing or occurring at the same time such that they are substantially coincident.

FIG. 1 illustrates a schematic diagram of an exemplary improved memory for graphics displays. The memory (100) shown includes eight memory blocks (Memory0–Memory7) for delivering display data to eight column drivers used for an XGA (Extended Graphics Array) resolution display. The memory blocks are arranged in 32 by 96 column array. The structure of the memory (100) may be modified to include any number of memory blocks with various array sizes to accommodate other display resolutions.

Data is written serially to the memory blocks (Memory0–Memory7) through an input port or bus (wrdata [95:0]). The data is read simultaneously (i.e., in parallel) to the column drivers through eight data outputs, or output ports (rddata0[23:0]-rddata7[23:0]).

Write enable signals (wren0[31:0]-wren7[31:0]) for each row of data are coupled to the memory blocks through eight write enable ports. Each write enable signal enables data to be written to an individual row of data within the memory (100). A separate enable signal is present for each row throughout the memory (100). For example, 'wren1[0]' enables row 0 of the first memory block (Memory0), whereas 'wren3[15] enables row 15 of the third memory block. In the example above, two or more write enable signals (wren0[31:0]-wren7[31:0]) may be activated at the same time.

Read enable signals (rden[31:0]) are also coupled through eight separate read enable ports to each corresponding row of data. The read enable signals enable like numbered rows for each memory block (Memory0–Memory7) and therefore operate differently than the write enable signals. Each correspondingly numbered row of each memory block is coupled to the same read enable signal (rden[31:0]). For example, 'rden[0]' enables row 0 of each memory block to be read simultaneously, and similarly 'rden[31]' enables row 31 of each memory block to be read simultaneously. In the example above, two or more read enable signals (rden[31:0]) are not activated at the same time.

In the present example, 24 bits of each 96-bit row is selected to be read from the memory at the same time. A pixel for an XGA resolution display corresponds to 24 bits of data, with eight bits for each of the three color planes. Accordingly, a 96-bit row contains four pixels worth of data. Each 96-bit row is divided into four "groupings" that each represent a pixel to be read from the memory. A multiplexer circuit included in each memory block (see FIG. 3) is controlled by the mux select signal (muxsel[3:0]) to select which of the "groupings" of data to read from the memory. For example, muxsel[0] selects the first 24 bits of each 96-bit row to be read from the memory, and similarly muxsel[3] selects the last 24 bits of each row to be read from the memory.

Signals wrpc_n, xfrdata, xfrpc_n, and rdpc_n[7:0] are used in the operation of each single-bit memory cell, as explained in the discussions of FIGS. 2 and 3 that follow below.

In other embodiments, the number of rows, the number of bits per row, the number of bits per "grouping" of data to be read, the number of memory blocks, the number of rows per memory block, and the like are adjustable as required for particular applications. For example, the number of memory blocks and the depth of each memory block may be increased or decreased. A resolution may utilize N column drivers and have Z pixels per line. The memory of the present invention may be designed with N memory blocks and a depth that corresponds to the Z pixels per line. Alternatively, the present invention may be designed for the highest resolution possible and include control logic (not shown) such that only the portion of the memory required for lower resolutions is used when those lower resolutions are selected.

Figure 2:
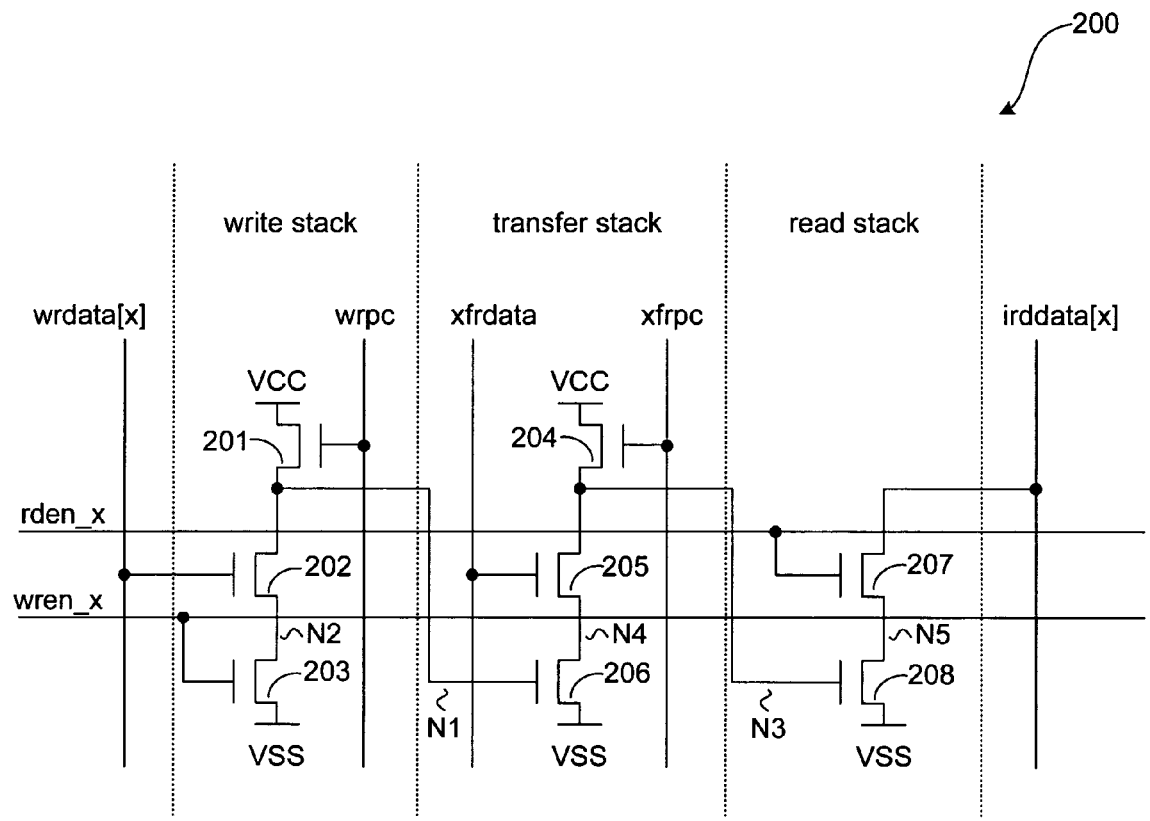
FIG. 2 shows a schematic diagram an exemplary one-bit memory cell.

FIG. 2 shows a schematic diagram an exemplary one-bit memory cell. The memory cell (200) includes eight transistors (201–208) separated according to three portions of the memory cell referred to as "stacks" (write stack, transfer stack, and read stack).

Transistors 201, 202, and 203 are included in the write stack. Transistors 204, 205, and 206 are included in the transfer stack. Transistors 207 and 208 are included in the read stack. Transistor 201 is coupled to signal wrpc, an upper supply rail (VCC), and node N1. Transistor 202 is coupled to signal wrdata, node N1, and node N2. Transistor 203 is coupled to one of the write enable signals (wren_x), node N2, and a lower supply rail (VSS). Transistor 204 is coupled to signal xfrpc, the upper supply rail (VDD), and node N3. Transistor 205 is coupled to signal xfrdata, node N3, and node N4. Transistor 206 is coupled to node N1, node N4, and the lower supply rail (VSS). Transistor 207 is coupled to one of the read enable signals (rden_x), signal irddata, and node N5. Transistor 208 is coupled to node N3, node N5, and the lower supply rail (VSS).

In operation, data is written to the write stack, transferred to the transfer stack, and read from the read stack. Separate bits may be read from and written to the same memory cell (200) during the same time interval. The timing of the write, transfer, and read operations is such that refresh circuitry for the memory is not required. The charge within the memory cell (200) for a logic "1" does not dissipate significantly between the write operation and the read operation. The need for refresh circuitry is avoided due to the speed at which display data is transmitted to and from the memory to a display.

Write Operation

The write operation includes a reset cycle and a write cycle. During the reset cycle, transistor 201 is activated in response to the write pre-charge signal (wrpc) such that the potential associated with node N1 is initialized to a logic "1". During the write cycle, transistor 203 is enabled in response to the write enable signal (wren_x) and transistor 202 is arranged to evaluate the data input signal (wrdata[x]). Node N1 is coupled to VSS through transistors 202 and 203 when the data input signal (wrdata[x]) corresponds to a logic "1" during the write cycle. Node N1 is isolated from VSS by transistor 202 when the data input signal (wrdata[x]) corresponds to a logic "0" during the write cycle.

Node N1 temporarily stores a "first stored logic level" that corresponds to an inverse of the logic level associated with the data input signal (wrdata[x]) at the end of the write cycle. Since node N1 is initialized to a logic "1" at the beginning of the reset cycle, the transfer cycle is initiated prior to the reset cycle such that the "first stored logic level" is not destroyed prior to the transfer operation.

Transfer Operation

The transfer operation includes a reset cycle and a transfer cycle. During the reset cycle, transistor 204 is activated in response to the transfer pre-charge signal (xfrpc) such that the potential associated with node N3 is initialized to a logic "1". During the transfer cycle, transistor 205 is enabled in response to the transfer data signal (xfrdata) and transistor 206 is arranged to evaluate the potential associated with node N1. Node N3 is coupled to VSS through transistors 205 and 206 when the potential associated with node N1 corresponds to a logic "1" during the transfer cycle. Alternatively, node N3 is isolated from VSS by transistor 206 when the potential associated with node N1 corresponds to a logic "0" during the transfer cycle.

Node N3 temporarily stores a "second stored logic level" that corresponds to an inverse of the "first stored logic level" from the preceding write operation. Since node N3 is initialized to a logic "1" at the beginning of the reset cycle of the transfer operation, the read operation is initiated prior to the reset cycle such that the "second stored logic level" is not destroyed as a result of the transfer operation.

Read Operation

The read operation includes a reset cycle and a read cycle. During the reset cycle, transistor 207 is disabled and the internal read data node (irddata[x]) is initialized to a logic "1" in response to the read pre-charge signal (rdpc_n[x], see FIG. 1). The read cycle is initiated by the activation of transistor 207 in response to the read enable signal (rden_x). Transistor 208 is arranged to evaluate the potential associated with node N3 while transistor 207 is active. Internal read data node (irddata[x]) is coupled to VSS through transistors 207 and 208 when the potential associated with node N3 corresponds to a logic "1" during the read cycle. Alternatively, internal read data node irddata[x] is isolated from VSS by transistor 208 when the potential associated with node N3 corresponds to a logic "0" during the read cycle. At the conclusion of the read cycle, the potential associated with the internal read data node (irddata[x]) is a "third stored logic level" that corresponds to an inverse of the "second stored logic level" associated with node N3.

When a bit of data is written to the memory cell, transferred through the memory cell, and read from the memory cell to be transmitted to a display, the write, transfer, and read operations are complete for that bit of data. However, the bit of data at the internal read data node (irddata[x]) has the inverse potential of the data at the data input signal (wrdata[x]). For example, when the data input signal (wrdata[x]) has a logic "1" state, the resultant state at the internal read data node (irddata[x]) after the write, transfer, and read operations is a logic "0". The inverse of the data at the internal read data node is therefore used to transmit to the display so that the data transferred to the display matches the data at the data input signal (wrdata[x]). In one embodiment, a multiplexer used in reading the data from the memory inverts the data to correspond to the potential of the data input signal (wrdata[x]).

In one embodiment, new data is written to the write stack of each memory cell while the previous data is read from the read stack of each memory cell. The memory cells operate similar to a two-line memory circuit by providing simultaneous read and write operations.

In light of the disclosure above, it is appreciated and understood that the partitioning of the memory cell (200) according to three stacks is representative for the purpose of explanation. The memory cell (200) may also be described without reference to stacks or according to another illustrative partitioning of the cell.

Figure 3:
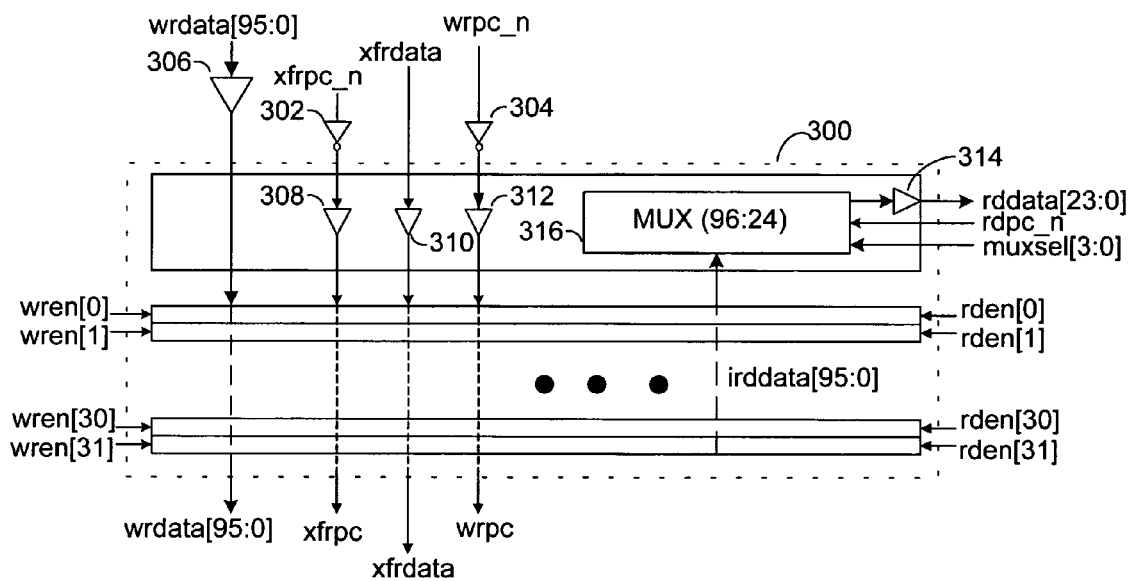
FIG. 3 illustrates a schematic diagram of an exemplary memory block.

FIG. 3 illustrates a schematic diagram of an exemplary memory block. The memory block (300) is a 32 row by 96 column memory block. Eight of the memory blocks are used to provide a memory circuit according to the example above for an XGA resolution. In another embodiment, the size of the memory block is selected according to other requirements, including other resolutions.

The memory block (300) includes four buffer circuits (308–314) and a multiplexer circuit (316). Additionally, the data input signal (wrdata[95:0]) is buffered by another buffer circuit (306) and the write and transfer pre-charge signals (wrpc_n, xfrpc_n) are inverted by inverter circuits (302, 304) before the signals are received by the memory block (300).

The buffer circuits (308–314) included in the memory block (300) are used to buffer either the incoming signals (e.g., xfrdata) or to buffer the data read to the column drivers for the display (rddata[23:0]).

The data input signal (wrdata[95:0]) is coupled to the memory blocks such that data is serially written to the memory block. The memory block (300) includes a predetermined number of lines of memory (e.g., 32 lines). Each line is a predetermined number of bits wide (e.g., 96 bits). In the present example, a single pixel of the display represents 24 bits of data. A row that is 96 bits wide therefore includes the data for four pixels. Each row is effective to write four pixels worth of data during a single write cycle. The clock rate for the write cycle is effectively one quarter of the clock rate for each pixel. In other embodiments, other factors are used to determine the width of each row such as the aspect ratio or die area consumed by the memory circuit.

As previously described, 24 bits of each 96 bit row are selected to be read from the memory simultaneously. The 24 bits correspond to a single pixel of the display, with eight bits corresponding to each of three color planes associated with the pixel. The multiplexer circuit (316) included in the memory block (300) is controlled by the mux select signal (muxsel[3:0]). The multiplexer (316) is used to select which 24 bits of data are read from the memory and is described in greater detail in the discussion of FIG. 4.

The internal read data nodes (irddata[95:0]) are shared between memory cells of the same column. For example, memory cell 55 of row 0 shares the same internal read data node (irddata[55]) as memory cell 55 of row 31. However, the sharing of the internal read data nodes (irddata[95:0]) requires that the internal read data nodes (irddata[95:0]) be reinitialized by the read pre-charge signal (rdpc_n[x]) between each row to support the read operation. The timing of the read pre-charge signal (rdpc_n[x]) is described further in the discussion of FIG. 5 below.

Figure 4:
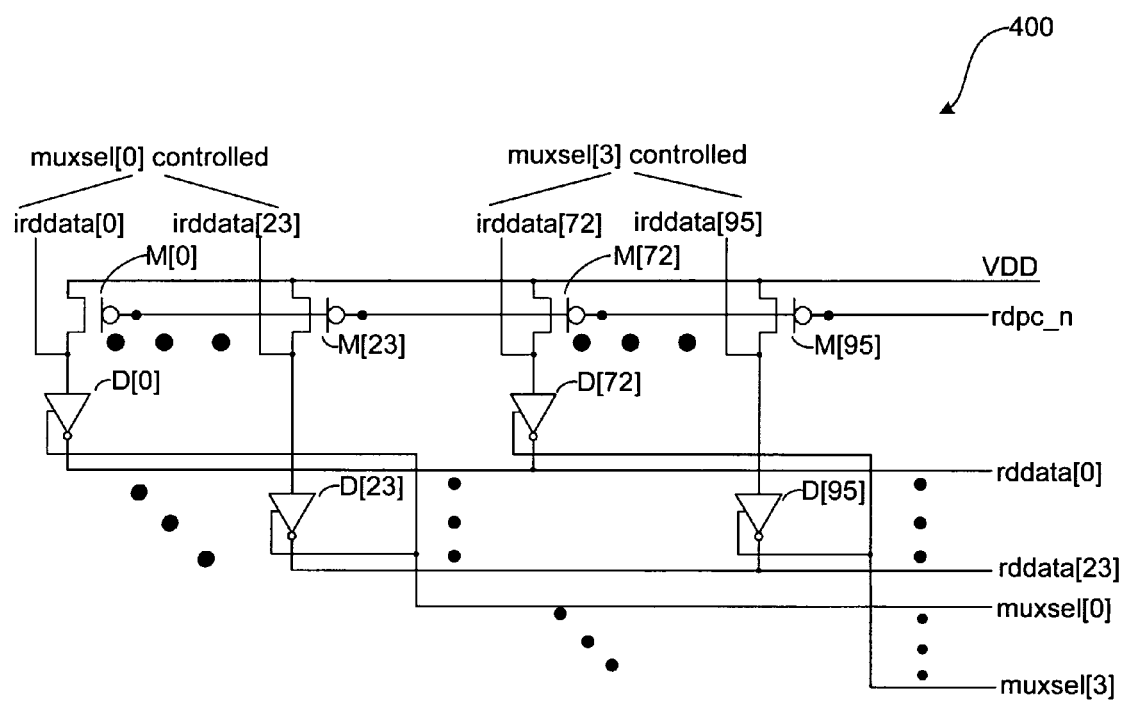
FIG. 4 illustrates a schematic diagram of an exemplary multiplexer circuit for use with an improved memory for graphics displays.

FIG. 4 illustrates a schematic diagram of an exemplary multiplexer circuit (400) for use with an improved memory for graphics displays. Multiplexer circuit 400 corresponds to multiplexer circuit 316 shown in FIG. 3 and the example of an XGA resolution display. The exemplary multiplexer circuit (400) includes four exemplary transistors (M[0], M[23], M[72], M[95]) and four exemplary tri-state drivers (D[0], D[23], D[72], D[95]).

Each of the internal read data nodes (irddata[95:0]) previously described in FIG. 3, includes a corresponding transistor (e.g., M[95:0]) and corresponding tri-state driver (e.g., D[95:0]). Each transistor (e.g., M[95:0]) is coupled to the upper supply rail (VDD), the read pre-charge signal (rdpc_n [7:0]) for the corresponding memory block (see FIG. 1), and a corresponding internal read data node (irddata[95:0]). Transistors M[0], M[23], M[72], M[95] are shown to exemplify the transistor layout, but it is appreciated from the discussion above that each multiplexer circuit (400) includes 96 transistors for the memory block of FIG. 3.

Each tri-state driver (e.g., D[95:0]) includes an input that is coupled to a corresponding internal read data node (irddata[95:0]), a control terminal that is coupled to a corresponding mux select signal (muxsel[3:0]), and an output that is coupled to one of the 24 data outputs (rddata[23:0]). According to the present example, the 96 bits of each row memory are divided into four groupings of 24 bits each. Each bit has a corresponding internal read data node (irddata [95:0]). The four mux select signals (muxsel[3:0]) accordingly correspond to the four groupings of internal read data nodes (e.g., irddata[23:0], irddata[47:24], irddata[71:48], irddata[95:72]) respectively. The tri-state drivers corresponding to the groupings are therefore coupled to their corresponding mux select signal (e.g, muxsel[0] is coupled to tri-state drivers D[23:0], and so on.). Tri-state drivers D[0], D[23], D[72], D[95] are shown to exemplify the tri-state driver layout, but it is appreciated from the discussion above that each multiplexer circuit (400) includes 96 tri-state drivers for the memory block (300) of FIG. 3.

In operation, one of the mux select signals (e.g., muxsel [0]) is active while the other mux select signals (e.g., muxsel[3:1]) are inactive. The active mux select signal (e.g., muxsel[0]) selects which set of 24 tri-state buffers (e.g., D[23:0]) to activate. Activating the selected set of 24 tri-state buffers (e.g., D[23:0]) results in an output on the 24 data outputs (rddata[23:0]) that corresponds to the "third stored logic level" (see discussion of FIG. 2) stored on the corresponding internal read data nodes (e.g., irddata[23:0]). The tri-state drivers (e.g., D[95:0]) perform the last inversion of the data (see discussion of FIG. 2) before transmitting the data to be formatted for the column drivers.

The other mux select signals (muxsel[3:0]) are activated in succession until the data for all 96 internal read data nodes (irddata[95:0]) have been output on the 24 data outputs (rddata[23:0]). The shared internal read data nodes (irddata [95:0]) reduces the number of connections required for the multiplexer to select which bits of each row are to be read and reduces the number of outputs required. The multiplexer is therefore able to read the bits from all rows through the same common connections. It is appreciated in light of the discussion above, that the multiplexer circuit (400) for each memory block may be altered as required to include any number of transistors and/or tri-state drivers.

Figure 5:
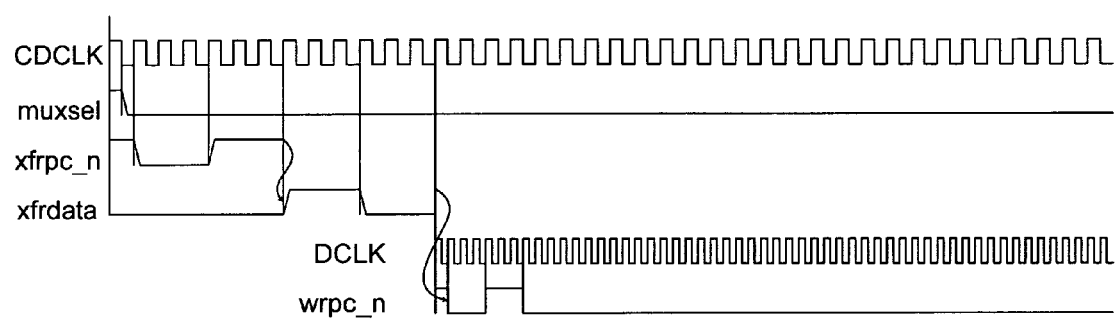
FIG. 5 shows an exemplary timing diagram for input and output signal characteristics of an improved memory for graphics displays.

FIG. 5 shows an exemplary timing diagram for input and output signal characteristics of an improved memory for graphics displays. The timing diagram includes exemplary signals for the column driver clock signal (CDCLK), the mux select signal (muxsel), the inverse of the transfer pre-charge signal (xfrpc_n), the transfer data signal (xfrdata), the writing clock signal (DCLK), and the inverse of the write pre-charge signal (wrpc_n).

According to the timing diagram, the transfer process occurs prior to the write process. The mux select signal (muxsel) transitions to a logic "0" when the read process is finished and the read stack (see FIG. 2) is available to receive to data. The inverse of the transfer pre-charge (xfrpc_n) transitions to a logic "0". Accordingly, the transfer pre-charge signal (xfrpc) transitions to a logic "1" commencing the transfer operation (see the discussion of FIG. 2 above). When xfrdata also transitions to a logic "1", the data for each memory cell is transferred from the write stack to the transfer stack simultaneously. Once the transfer operation is complete, the inverse of the write pre-charge signal (wrpc_n) transitions to a logic "0". Accordingly the write pre-charge signal (wrpc) transitions to a logic "1" commencing the write operation (see the discussion of FIG. 2 above). In another embodiment, the transfer operation need not occur for each memory cell simultaneously. Rather, each memory cell transfers the data at any time when a read operation is not occurring and prior to the commencement of a write operation.

In addition, the timing diagram illustrates that the write operation and the transfer operation are based on separate clock signals (CDCLK, DCLK). In another embodiment, the write operation and transfer operation are based on the same clock signal.

Figure 6:
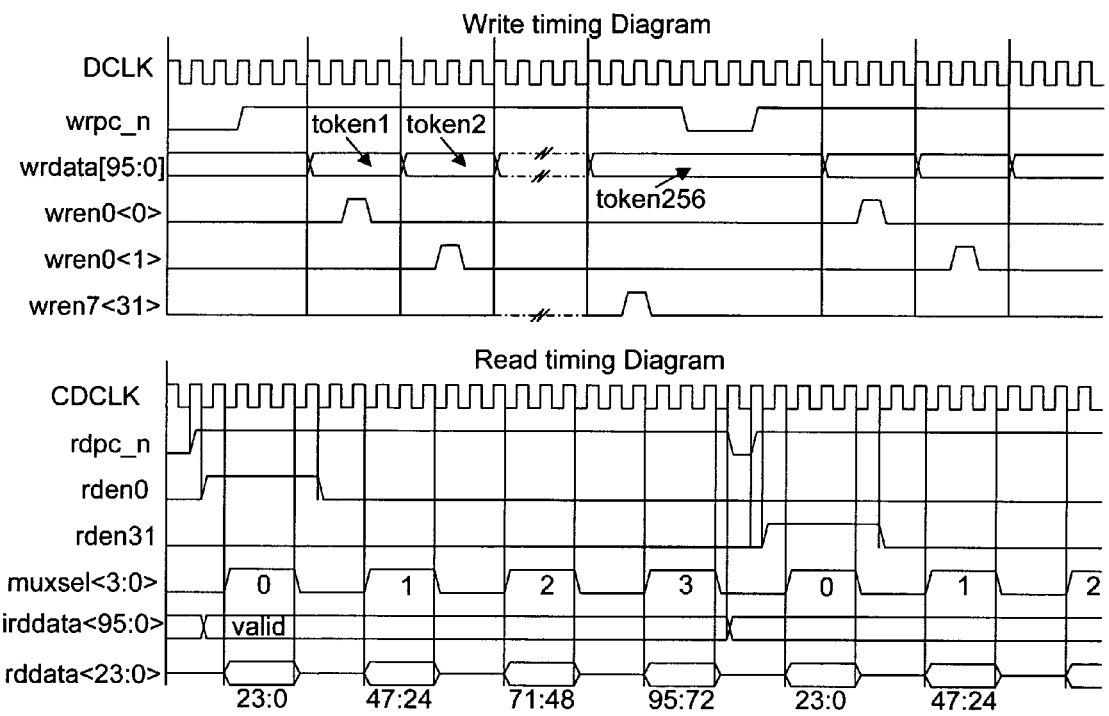
FIG. 6 illustrates exemplary timing diagrams for the write and read operations of an improved memory for graphics displays, in accordance with the present invention.

FIG. 6 illustrates exemplary timing diagrams for the write and read operations of an improved memory for graphics displays, in accordance with the present invention. The timing diagrams illustrate an exemplary write timing diagram and an exemplary read timing diagram. It is appreciated from the discussion above that the write and read operations may occur simultaneously within the same memory cell for separate bits of data.

The write timing diagram follows the XGA example given above, and includes the write clock signal (DCLK), the inverse of the write pre-charge signal (wrpc_n), the data input signal (wrdata[95:0]), the first write enable signal of the first memory block (wren0[0]), the second write enable signal of the first memory block (wren0[1]), and the last write enable signal for the eighth memory block (wren7 [31]).

The write operation commences when the inverse of the write pre-charge signal (wrpc_n) transitions to a logic "0".

Correspondingly, the write pre-charge signal (wrpc) transitions to a logic "1" (see FIG. 2). The data (wrdata[95:0]) is illustrated as tokens, wherein each token corresponds to 96 bits or one row. The data is written to the memory according to each successive write enable signal (wren0[31:0]-wren 7[31:0]). When the last token is written to the memory, the write operation is complete and processing waits for the write pre-charge signal (wrpc) to transition to a logic "1" again before commencing another write operation.

The read timing diagram also follows the XGA example given above, and includes the column driver clock signal (CDCLK), the inverse of the read pre-charge signal (rdpc_n), the read enable signal for the first row of data (rden0)), the read enable signal for the last row of data (rden31), the mux select signal (muxsel[3:0]), the internal read data node potentials (irddata[95:0]), and the data output signal (rddata[23:0]).

The read operation commences when the inverse of the read pre-charge signal (rdpc_n) transitions to a logic "0". Correspondingly, the read pre-charge signal (rdpc) transitions to a logic "1" (see FIG. 2). The read enable signals (rden[31:0]) enable the data to be read simultaneously from the eight output ports one row at a time. The mux select signal (muxsel[3:0]) changes state successively from 0 to 3 for each row read from the memory. The 96 bits of each row are divided into 24 bit "groupings" which are successively read from the memory in response to transitions of the mux select signal (muxsel[3:0]). the 96 bits are valid and available to be read from the memory, but the multiplexer of each memory block (see FIG. 3) limits the simultaneous read operation to the 24 bit groupings. Accordingly, bits 0–23 of each first row of each memory block are read simultaneously first, followed by bits 24–47 of each first row of each memory block, and so on as shown in FIG. 6. It is appreciated in light of the discussion above that any number of bits may be chosen to be read from the memory simultaneously, including all 96 bits of each row.

In addition, the timing diagram illustrates that the write operation and the read operation are based on separate clock signals (CDCLK, DCLK). In another embodiment, the write operation and read operation are based on the same clock signal.

Other embodiments of the invention are possible without departing from the spirit and scope of the invention. For example, the N-type transistors of FIG. 2 may be restructured for P-type transistors or Bipolar transistors. The above specification, examples and data provide a complete description of the manufacture and use of the composition of the invention. Since many embodiments of the invention can be made without departing from the spirit and scope of the invention, the invention resides in the claims hereinafter appended.

We claim:

1. A method for temporarily storing data for a graphics display, comprising:

storing a first potential at a first node of a memory cell during a write cycle in response to a bit of data;

storing a second potential at a second node of the memory cell during a transfer cycle in response to the first potential;

reading the second potential from the second node during a read cycle; and transmitting data that corresponds to the second potential to the graphics display through a data output.

2. The method of claim 1, further comprising:

storing a third potential at a third node of another memory cell during a write cycle in response to another bit of data;

storing a fourth potential at a fourth node of the other memory cell during a transfer cycle in response to the third potential;

reading the fourth potential from the fourth node during a read cycle; and transmitting data that corresponds to the fourth potential to the graphics display through another data output.

3. The method of claim 2, wherein the data corresponding to the second potential and the data corresponding to the fourth potential are simultaneously transmitted through their respective data outputs.

4. The method of claim 1, further comprising:

resetting the first node in response to a first reset signal when the transfer cycle is complete; and resetting the second node in response to a second reset signal when the read cycle is complete.

5. The method of claim 1, wherein the memory cell is included with other memory cells in an array of memory cells that is organized into memory blocks, such that the data output corresponds to an output port of one of the memory blocks.

6. The method of claim 5, wherein data corresponding to a portion of each of the other memory cells is transmitted from each of the memory blocks in parallel.

7. A memory circuit for a graphics display, comprising:

a memory cell, comprising:

a first portion of the memory cell that is arranged to store a first stored logic level at a first node in response to a bit of a data input signal during a write cycle;

a second portion of the memory cell that is arranged to store a second stored logic level at a second node in response to the first stored logic level during a transfer cycle; and a third portion of the memory cell that is arranged to read the second stored logic level from the second node during a read cycle, such that the second stored logic level corresponds to the bit of the data input signal and is transmitted from the memory cell through an output port for use in generating an image on the graphics display.

8. The memory circuit of claim 7, further comprising another memory cell that is arranged similarly to the memory cell and includes a third stored logic level that corresponds to another bit of the data input signal, wherein the third stored logic level is transmitted through another output port for use in generating the image on the graphics display.

9. The memory circuit of claim 8, wherein the second stored logic level and the third stored logic level are simultaneously transmitted through their respective output ports.

10. The memory circuit of claim 7, wherein the first node is coupled to a first reset signal such that the first node is reset when the transfer cycle is complete and the second node is coupled to a second reset signal such that the second node is reset when the read cycle is complete.

11. An apparatus for temporarily storing data for a graphics display, comprising:

a memory cell that includes:

a first transistor that is coupled to a first reset signal, an upper supply rail, and a first node;

a second transistor that is coupled to a data input signal, the first node and a second node;

a third transistor that is coupled to a write enable signal, the second node, and a lower supply rail;

a fourth transistor that is coupled to a second reset signal, the upper supply rail, and a third node;

a fifth transistor that is coupled to a transfer signal, the third node, and a fourth node;

a sixth transistor that is coupled to the first node, the fourth node, and the lower supply rail;

a seventh transistor that is coupled to a read enable signal, a fifth node, and a sixth node, wherein the sixth node corresponds to the output of the memory cell; and an eighth transistor that is coupled to the third node, the fifth node, and the lower supply rail.

12. The apparatus of claim 11, wherein:

the first transistor is arranged to couple the first node to the upper rail in response to the first reset signal;

the second transistor is arranged to couple the first node to the second node in response to the data input signal;

the third transistor is arranged to couple the second node to the lower supply rail in response to the write enable signal;

the fourth transistor is arranged to couple the third node to the upper supply rail in response to the second reset signal;

the fifth transistor is arranged to couple the third node to the fourth node in response to the transfer signal;

the sixth transistor is arranged to couple the fourth node to the lower supply rail in response to a potential at the first node;

the seventh transistor is arranged to couple the fifth node to the sixth node in response to the read enable signal; and the eighth transistor is arranged to couple the fifth node to the lower supply rail in response to a signal at the third node.

13. The apparatus of claim 11, further comprising another memory cell that is similarly arranged to the memory cell, wherein the other memory cell is configured to transmit data that corresponds to another bit of the data input signal from another output port corresponding to an output of the other memory cell simultaneously when the data that corresponds to a bit of the data input signal is transmitted.

14. The apparatus of claim 11, wherein the memory cell is arranged to transmit data that corresponds to a bit of the data input signal from an output port corresponding to the output of the memory cell when the seventh transistor is activated.

15. The apparatus of claim 14, wherein the memory cell is included with other memory cells in an array of memory cells that is organized into memory blocks, such that the output port is an output port of one of the memory blocks.

16. A system for storing data for a graphics display, comprising:

a first memory cell that is arranged to store a first bit of data;

a second memory cell that is arranged to store a second bit of data;

a data input that is arranged to input the first and second bit of data into the first memory cell and the second memory cell;

a first data output that is arranged to output the first bit of data from the first memory cell; and a second data output that is arranged to output the second bit of data from the second memory cell, wherein the first bit of data and the second bit of data are output in parallel from their respective data outputs.

17. The system of claim 16, wherein the first memory cell is included in a first array of memory cells that are arranged in a first memory block, and the second memory cell is included in a second array of memory cells that are arranged in a second memory block.

18. The system of claim 17, further comprising a first multiplexer circuit that is associated with the first memory block, wherein the first multiplexer circuit is arranged to output a pre-selected portion of the data corresponding to the first array of memory cells.

19. The system of claim 18, further comprising a second multiplexer circuit that is associated with the second memory block, wherein the second multiplexer circuit is arranged to output a pre-selected portion of the data corresponding to the second array of memory cells simultaneously when the pre-selected portion of the data corresponding to the first array of memory cells is output.

20. The system of claim 16, wherein the first memory cell includes:

a first portion of the memory cell that is arranged to store a first stored logic level at a first node in response to a bit of a data input signal during a write cycle;

a second portion of the memory cell that is arranged to store a second stored logic level at a second node in response to the first stored logic level during a transfer cycle; and a third portion of the memory cell that is arranged to read the second stored logic level from the second node during a read cycle, such that the second stored logic level corresponds to the bit of the data input signal and is transmitted from the memory cell through an output port for use in generating an image on the graphics display.

* * * * *

UNITED STATES PATENT AND TRADEMARK OFFICE
CERTIFICATE OF CORRECTION

PATENT NO.   : 6,930,929 B1
DATED        : August 16, 2005
INVENTOR(S)  : Erhart et al.

Page 1 of 1

It is certified that error appears in the above-identified patent and that said Letters Patent is hereby corrected as shown below:

Column 9,
Line 15, replace "(rden0))" with -- (rden0) --.

Column 11,
Line 17, add -- supply -- after "upper".

Signed and Sealed this

Tenth Day of January, 2006

JON W. DUDAS
*Director of the United States Patent and Trademark Office*